US009829751B2

United States Patent
Zhou et al.

(10) Patent No.: US 9,829,751 B2
(45) Date of Patent: Nov. 28, 2017

(54) TOUCH DISPLAY AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Weifeng Zhou, Beijing (CN); Jian Guo, Beijing (CN); Xing Ming, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 180 days.

(21) Appl. No.: 14/718,489

(22) Filed: May 21, 2015

(65) Prior Publication Data

US 2015/0253609 A1 Sep. 10, 2015

Related U.S. Application Data

(62) Division of application No. 12/717,284, filed on Mar. 4, 2010, now Pat. No. 9,069,204.

(30) Foreign Application Priority Data

Mar. 4, 2009 (CN) .......................... 2009 1 0078840

(51) Int. Cl.
*H01L 27/12* (2006.01)
*G02F 1/1339* (2006.01)
(Continued)

(52) U.S. Cl.
CPC ...... *G02F 1/13394* (2013.01); *G02F 1/13338* (2013.01); *G02F 1/133512* (2013.01);
(Continued)

(58) Field of Classification Search
CPC .................................................. G02F 1/13394
See application file for complete search history.

(56) References Cited

U.S. PATENT DOCUMENTS 6,304,251 B1 10/2001 Ito et al.
2003/0205450 A1 11/2003 Divigalpitiya et al.
(Continued)

FOREIGN PATENT DOCUMENTS

CN 1650377 A 8/2005
CN 1975517 A 6/2007

OTHER PUBLICATIONS

U.S. RR dated May 9, 2012 in connection with U.S. Appl. No. 12/717,284.
(Continued)

*Primary Examiner* — Fernando L Toledo
*Assistant Examiner* — Valerie N Newton
(74) *Attorney, Agent, or Firm* — Ladas & Parry LLP

(57) ABSTRACT

A touch display comprises a color filter substrate, an array substrate opposite to the color filter via a plurality of spacers and a voltage detection circuit. The color filter substrate comprises an upper substrate and a common electrode formed on the upper substrate, and the array substrate comprises a lower substrate and a gate line, a data line and a pixel electrode formed on the lower substrate. The plurality of spacers comprise a first spacer formed between the gate line and the common electrode and a second spacer formed between the data line and the common electrode, which are capable of electrically connecting the common electrode with the gate line and the data line respectively
(Continued)

under an external pressure more than a threshold value. The voltage detection circuit is connected with the gate line and the data line so as to detect whether the voltage on the gate line and the voltage on the data line become equal to the voltage of the common electrode.

7 Claims, 3 Drawing Sheets

(51) Int. Cl.
  *G06F 3/041* (2006.01)
  *G02F 1/1333* (2006.01)
  *G02F 1/1335* (2006.01)

(52) U.S. Cl.
  CPC ...... *G02F 1/133514* (2013.01); *G06F 3/0412* (2013.01); *G06F 3/0414* (2013.01); *H01L 27/1259* (2013.01)

(56) References Cited

U.S. PATENT DOCUMENTS

| | | | |
|---|---|---|---|
| 2007/0070047 | A1 | 3/2007 | Jeon et al. |
| 2007/0097278 | A1 | 5/2007 | Rho et al. |
| 2007/0262967 | A1 | 11/2007 | Rho |
| 2007/0281516 | A1 | 12/2007 | Yamada et al. |
| 2008/0018613 | A1 | 1/2008 | Kim et al. |
| 2008/0111773 | A1 | 5/2008 | Tsuge |
| 2008/0117182 | A1 | 5/2008 | Um et al. |
| 2008/0122800 | A1 | 5/2008 | Meng |
| 2008/0129898 | A1 | 6/2008 | Moon |
| 2008/0186288 | A1 | 8/2008 | Chang |
| 2009/0225047 | A1* | 9/2009 | Lee ............... G02F 1/13338 345/173 |
| 2009/0237369 | A1* | 9/2009 | Hur ............... G06F 3/0412 345/173 |

OTHER PUBLICATIONS

U.S. NFOA dated Aug. 24, 2012 in connection with U.S. Appl. No. 12/717,284.

U.S. FOA dated Jan. 24, 2013 in connection with U.S. Appl. No. 12/717,284.

U.S. AA dated Apr. 11, 2013 in connection with U.S. Appl. No. 12/717,284.

U.S. NFOA dated Aug. 12, 2013 in connection with U.S. Appl. No. 12/717,284.

U.S. FOA dated Jan. 9, 2014 in connection with U.S. Appl. No. 12/717,284.

U.S. NFOA dated Sep. 16, 2014 in connection with U.S. Appl. No. 12/717,284.

U.S. NOA dated Mar. 18, 2015 in connection with U.S. Appl. No. 12/717,284.

\* cited by examiner

TOUCH DISPLAY AND MANUFACTURING
METHOD THEREOF

BACKGROUND

Embodiments of the present invention relate to a touch display and a manufacturing method thereof.

In the recent ten years, liquid crystal displays (LCDs) are developed rapidly and achieve a great improvement on screen size, display quality and the like. Furthermore, the LCDs have the advantage of small volume, low energy consumption, low radiation, and etc., and thus prevail in the flat panel display market.

In a liquid crystal display, a touch display is an important device integrating the function of an input terminal and an output terminal. As small and light handheld devices such as the Iphone (trademark) manufactured by Apple Inc. was put into market, the demand for the touch display is increasing. A touch display can be typically formed by imposing a touch screen on a display screen, that is, two screens are manufactured for forming the touch display, and thus the manufacture cost is increased.

SUMMARY

A touch display comprises a color filter substrate, an array substrate opposite to the color filter via a plurality of spacers and a voltage detection circuit. The color filter substrate comprises an upper substrate and a common electrode formed on the upper substrate, and the array substrate comprises a lower substrate and a gate line, a data line and a pixel electrode formed on the lower substrate. The plurality of spacers comprise a first spacer formed between the gate line and the common electrode and a second spacer formed between the data line and the common electrode, which are capable of electrically connecting the common electrode with the gate line and the data line respectively under an external pressure more than a threshold value. The voltage detection circuit is connected with the gate line and the data line so as to detect whether the voltage on the gate line and the voltage on the data line become equal to the voltage of the common electrode.

A method of manufacturing a touch display is provided in another embodiment of the invention. The method comprises: providing a color filter substrate, the color filter substrate comprising an upper substrate and a common electrode formed on the upper substrate; providing an array substrate, the array substrate comprising a lower substrate, and a gate line, a data line and a pixel electrode formed on the lower substrate, wherein a plurality of spacers are formed on the array substrate and comprise a first spacer connected with the gate line and a second spacer connected with the data line; and assembling the color substrate and the array substrate to form the touch display, wherein the first and second spacers abut against the common electrode on the color filter substrate and are capable of electrically connecting the common electrode with the gate line and the data line respectively under an external pressure more than a threshold value.

Further another embodiment of the invention also provides a method of manufacturing a touch display and may comprise the following steps: providing a color filter substrate, the color filter substrate comprising an upper substrate, a common electrode formed on the upper substrate, and a plurality of spacers formed on the common electrode and connected with the common electrode; providing an array substrate, the array substrate comprising a lower substrate, and a gate line, a data line and a pixel electrode formed on the lower substrate; and assembling the color substrate and the array substrate to form the touch display, wherein the plurality of spacers comprise a first spacer abutting against the gate line on the array substrate and a second spacer abutting against the data line on the array substrate, which are capable of electrically connecting the common electrode with the gate line and the data line respectively under an external pressure more than a threshold old value.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE EMBODIMENTS

A touch display and a manufacturing method thereof, which are capable of integrating a touch screen and a display screen into a single screen so that the touch display can become thinner, are provided in the embodiments of the invention.

Hereinafter, the embodiments of the present invention will be described in detail with reference to the accompanying drawings.

First Embodiment of The Touch Display

Figure 1:
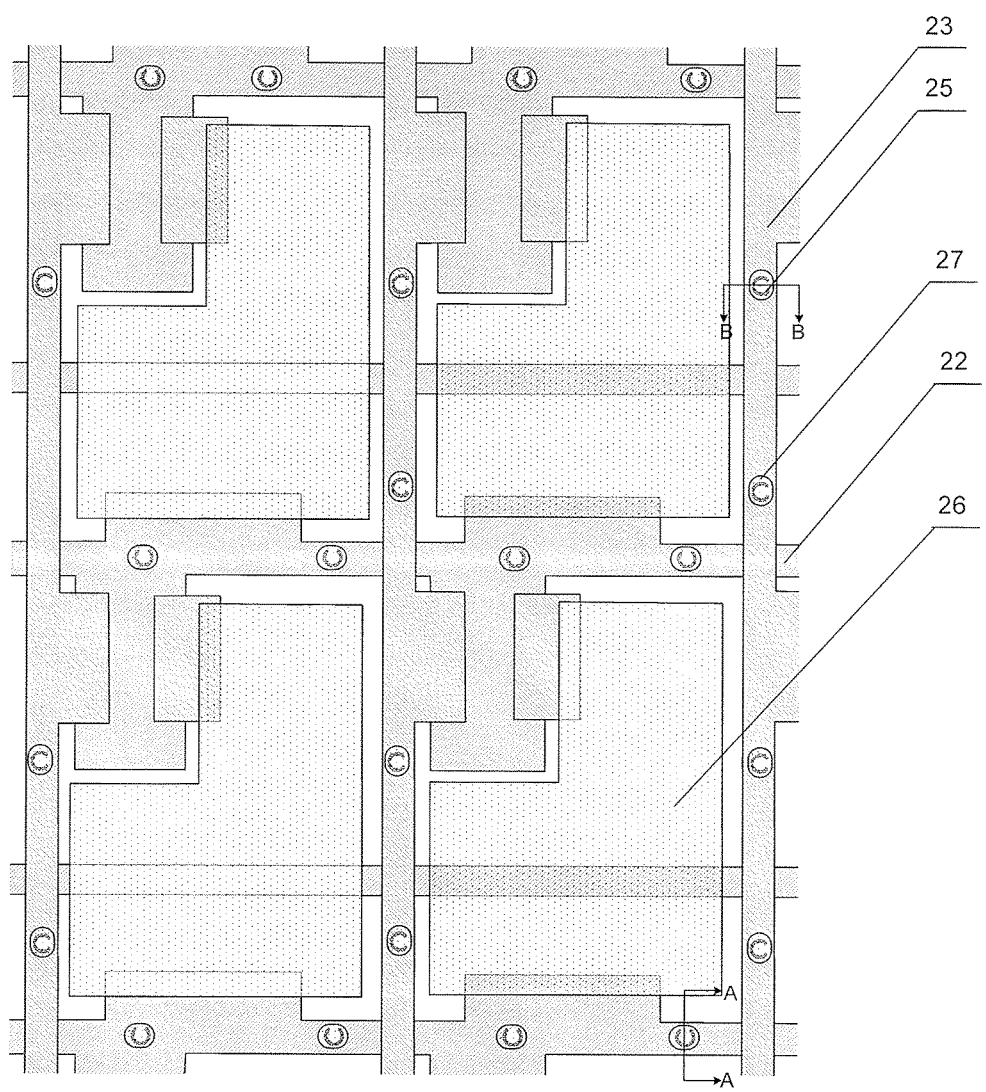
FIG. 1 is a top view showing an array substrate in a first embodiment of a touch display according to the invention.
Figure 2:
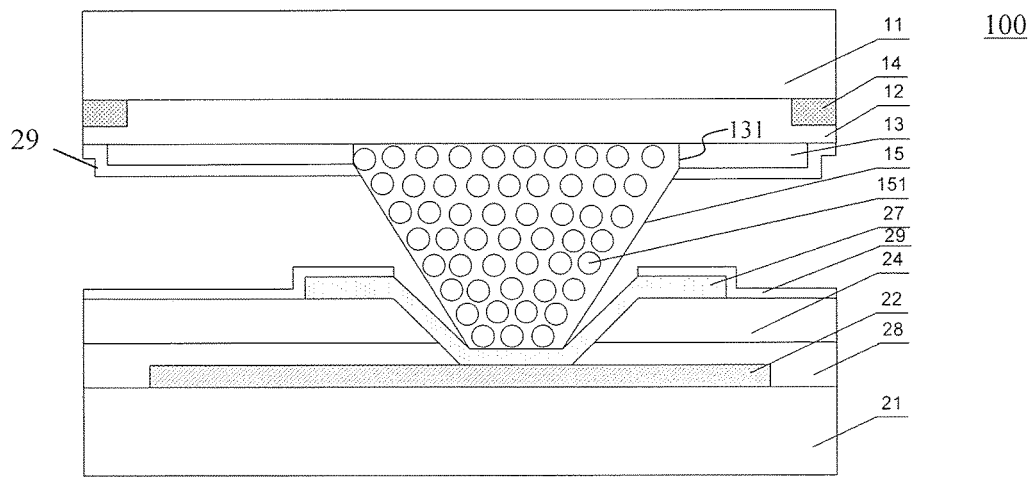
FIG. 2 is a sectional view showing a spacer formed at a position on a gate line in the first embodiment of the touch display according to the invention.

FIG. 1 is a top view showing an array substrate in a first embodiment of a touch display according to the invention; FIG. 2 is a sectional view showing a spacer formed at a position on a gate line in the first embodiment of the touch display according to the invention; and FIG. 3 is a sectional view showing a spacer formed at a position on a data line in the first embodiment of the touch display according to the invention.

Figure 3:
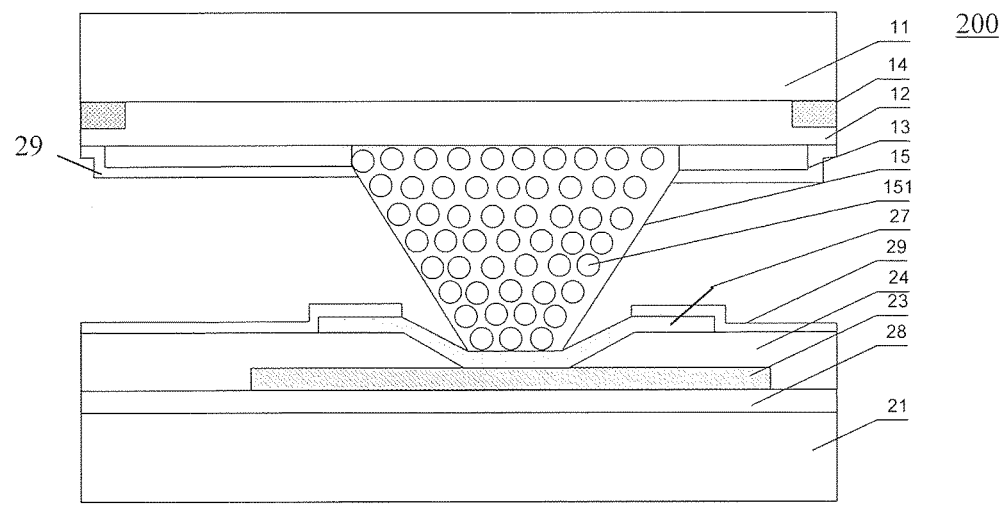
FIG. 3 is a sectional view showing a spacer formed at a position on a data line in the first embodiment of the touch display according to the invention.

As shown in FIGS. 1-3, the touch display 100 provided in the first embodiment comprises a filter color substrate and an array substrate opposite to the color filter substrate. The color filter substrate comprises an upper substrate 11 and a common electrode 12 formed on the upper substrate 11, and the array substrate comprises a lower substrate 21 and a gate line 22, a data line 23 and a pixel electrode 26 formed on the lower substrate 21. A plurality of spacers 15, which are capable of electrically connecting the common electrode 12 with the gate line 22 and the data line 23 under an external pressure more than the threshold value are further formed on the common electrode 12. For example, the spacer 15 corresponding to the gate line 22 can be called as the first spacer, while the spacer 15 corresponding to the data line 23 can be called as the second spacer. The touch display 100 further comprises a voltage detection circuit (not shown). The voltage detection circuit is connected with the gate line 22 and the data line 23 for detecting whether the voltage on the gate line 22 and the voltage on the data line 23 is equal to the voltage of the common electrode 12. Preferably, the voltage detection circuit is provided on the array substrate; on the other hand, the voltage detection circuit may be provided separately or on the color filter substrate.

In the touch display 100 in the this embodiment, the plurality of spacers 15 are provided on the common electrode 12 formed on the color filter substrate, and at the same time, each of the plurality of spacers 15 abuts against the gate line 22 or the data line 23 formed on the array substrate. When one spacer 15 is under an external pressure more than the threshold value, the common electrode 12 can be electrically connected with the corresponding gate line 22 or data line 23. Accordingly, whether the voltage on the gate line 22 or the data line 23 at the touch point is equal to the voltage of the common electrode can be detected by the voltage detection circuit, and thus the position of the touch point can be determined. In this way, a single touch display can have the functions of both of the touch screen and the display screen, and thus the manufacture process can be simplified and the manufacture cost can be reduced. In addition, in the touch display 100, the problem that the touched is not the seen due to the misalignment between the screens and refraction between the display screen and the touch screen can be avoided, and thus the color stability of the color filter substrate can be improved and the manufacture accuracy can be increased. Therefore, the product quality and the manufacture efficiency of the thin film transistor liquid crystal display (TFT-LCD) employing the touch display with the above-described structure can be increased, and thus the manufacture cost can be further reduced.

As shown in FIG. 2 and FIG. 3, a black matrix 13 is formed on the common electrode 12, and a plurality of black matrix via holes 131 are formed in the black matrix 13. The spacers 15 are connected with the common electrode 12 through the black matrix via holes 131. In order to ensure the light transmission of in the pixel region, for example, the spacers 15 may be formed at the positions corresponding to the black matrix 13. The common electrode 12 may be directly formed on the upper substrate 11 on which a color filter unit 14 has been formed.

Second Embodiment of The Touch Display

The second embodiment is different from the first embodiment in that: the black matrix 13 is formed on the upper substrate 11 on which the color filter unit 14 has been formed, the common electrode 12 is formed on the black matrix 13 and the spacers 15 are directly connected with the common electrode 12. In order to ensure the light transmission of in the pixel region, the spacers 15 are provided at the positions corresponding to the black matrix 13.

Third Embodiment of The Touch Display

The third embodiment is based on the combination of the first and second embodiments. FIG. 2 is a sectional view taken along the line A-A in FIG. 1 and FIG. 3 is a sectional view taken along the line B-B in FIG. 1. As shown in FIG. 2 and FIG. 3, in the third embodiment, a passivation layer 24 is further formed on the lower substrate 21, passivation layer via holes 25 are formed at positions corresponding to the spacers 15, and each of the spacers 15 abuts against the gate line 22 or the data line 23 through the respective passivation layer via hole 25. Since the passivation layer 24 is formed on the gate line 22 and the data line 23, it is necessary to form the passivation layer via holes 25 so that the spacers 15 abut against the gate line 22 and the data line 23. In addition, as shown, the passivation layer via hole 25 on the gate line 22 necessarily penetrates both of the passivation layer 24 and a gate insulating layer 28, and the passivation layer via hole 25 on the data line penetrates the passivation layer 24 only.

Furthermore, a conductive protection layer 27 is formed at each of the passivation layer via holes 25. The conductive protection layer 27 ensures that the spacers 15 are positioned in the passivation layer via holes 25 irrespective of whether the spacers 15 are deformed under pressing or not. In addition, the conductive protection layer 27 can avoid accidental electrical conduction.

Furthermore, the conductive protection layer 17 is formed in the same layer as the pixel electrode 26. For example, the conductive protection layer 17 may be formed by transparent material such as indium tin oxide (ITO) or indium zinc oxide (IZO).

Figure 4:
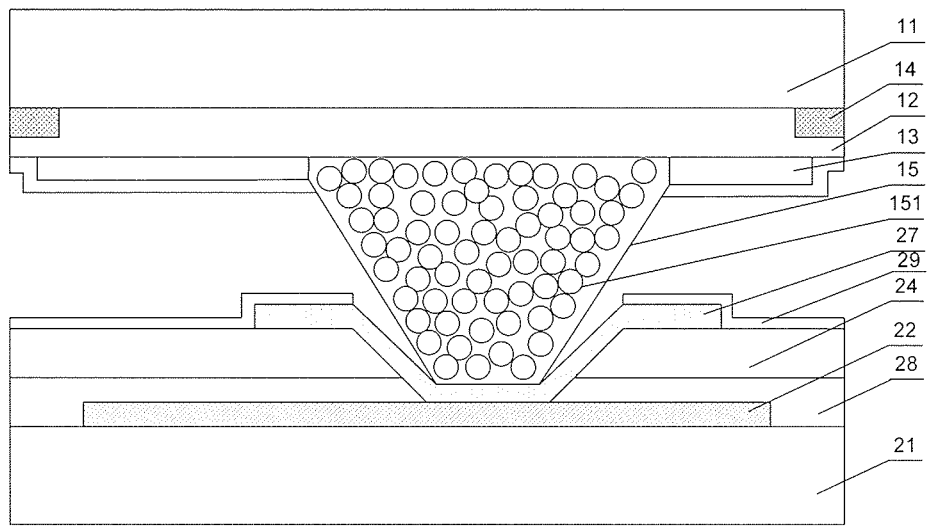
FIG. 4 is a schematic view showing the spacer of FIG. 2 under an external pressure.
Figure 5:
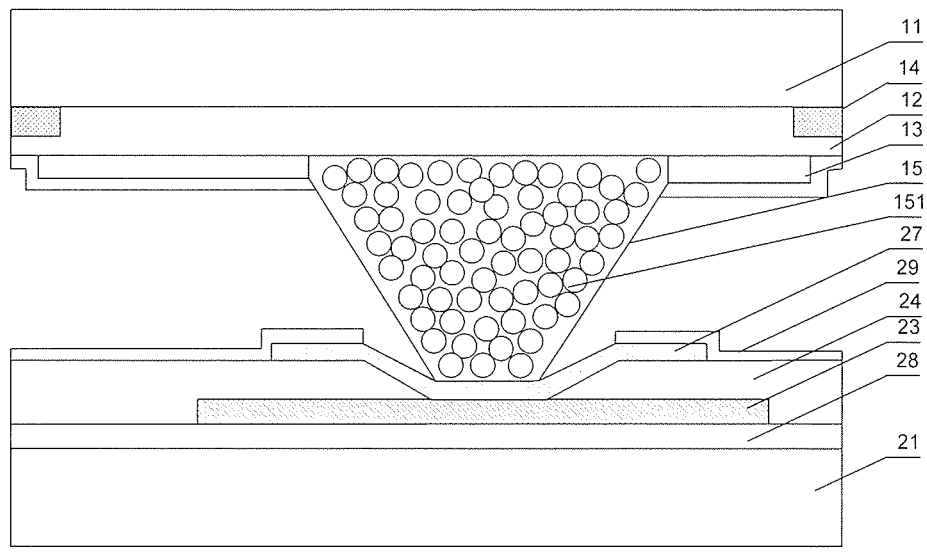
FIG. 5 is a schematic view showing the spacer of FIG. 3 under an external pressure.

In the above first, second and third embodiments, the spacers 15 are columnar spacers, and the spacers 15 can be formed by a mixture material of resin or rubber with conductive particles 151. Preferably, epoxy resin, polyurethane resin or elastic plastic resin can be used for the resin. The resin or the rubber has an elastic netlike structure so that the conductive particles (e.g., metal particles or carbon particles) 151 can be mixed therein. Under an external pressure, a favorable contact can be obtained among the conductive particles. When the external pressure does not exist or is smaller than the threshold value, most of the dispersed conductive particles 151 are still separated and insulated from each other. FIG. 4 is a schematic view showing the spacer of FIG. 2 under an external pressure; and FIG. 5 is a schematic view showing the spacer of FIG. 3 under an external pressure. As shown in FIG. 4 and FIG. 5, under the external pressure larger than the threshold value, most of the conductive particles 151 at the position subject to the external pressure contact with each other, in which case a conduction path can be established in the vertical direction and both ends of the spacer 15 are electrically connected; after the external pressure is released, the resin or the rubber recovers as it is originally, and thus the conductive particles 151 are separated and insulated from each other again. Here, the spacers 15 under pressing function like an anisotropy conductive material.

In addition, as shown in FIG. 2 and FIG. 3, alignment layers 29 are applied on the upper substrate 11 and the lower substrate 21, respectively. One alignment layer 29 is formed on the entirety of the conductive protection layer 27. Since the spacer 15 containing metal particles has a relatively high hardness, the spacers 15 can penetrate the alignment layer 29 and abut on the conductive protection layer 27 so as to be ready to constitute an electrical connection when the color filter substrate and the array substrate are assembled together. In order that the spacers 15 can reliably abut against the conductive protection layer 27, the alignment layer 29 at the passivation layer via holes 25 can be etched away, and thus a better electrical connection can be obtained.

On the other hand, in the embodiments, the spacers 15 can also be formed on the array substrate at positions on the gate line and data line. After the color filter substrate and the array substrate are assembled together, the spacers 15 formed on the array substrate can abut against the common electrode formed on the color filter substrate. Furthermore, a conductive protection layer can be formed at the positions corresponding to the spacers 15. Under an external pressure more than the threshold value, the spacers can become conductive in the vertical direction for electrically connecting the gate line and data line on the array substrate and common electrode on the color filter substrate.

Hereinafter, the operation mechanism of the touch display in the embodiments will be explained.

When a point on the touch display is touched and the external pressure at the touch point is larger than the threshold value, the gate line at the touch point, for example, is electrically connected with the common electrode on the color filter substrate by the conductive particles contained in the corresponding spacer, and at the same time, the data line at the touch point, for example, is also electrically connected with the common electrode on the color filter substrate by the conductive particles contained in another corresponding spacer. Thus, at the touch point, both the voltage on the gate line and the voltage on the data line become equal to the common voltage. Then, the voltage detection circuit connecting with the gate line and the data line feedbacks the serial numbers of the gate line and the data line with the voltage equal to the common voltage to a controller, and thus the coordinates of the touch point can be determined in the controller.

At the same time, one vertical line and one horizontal line may be formed at the touch point, and thus the user can judge whether the correct position is touched by the cross point of these two lines.

The mechanism of forming the vertical and horizontal lines is explained as follows. When the common electrode on the color filter substrate is electrically connected with the gate line at the touch point, the voltage on the gate line becomes equal to the common voltage, and thus the thin film transistors (TFTs) of the pixels corresponding to the gate line are all turned on so that one lateral bright line appears corresponding to the gate line. Because the area of the touch point by the object (such as a finger, a pen and the like) touching the screen is much larger than that of a sub-pixel, the width of bright line is substantially equal to the diameter of the touch point. Similarly, when the common electrode on the color filter substrate is electrically connected with the data line at the touch point, the voltage on the data line becomes equal to the common voltage, and thus the same voltage (equal to the common voltage) is applied on the pixels corresponding to the data line when the gate lines are scanned line by line so that one uniform and vertical bright line appears. The area of the touch point of the object (such as a finger, a pen and the like) touching the screen is much larger than that of a sub-pixel, the pixels of three primary colors of RGB (Red, Green, and Blue) are uniformly formed in the direction of a gate line, and the pixels have the same voltage. Therefore, at the touch point, one white line formed by the three primary colors of RGB extends in the direction of the data line, and the width of white line is substantially equal to the diameter of the touch point.

A method of manufacturing a touch display is also provided in an embodiment of the invention. The method may comprise the following steps: forming a color filter substrate with a plurality of spacers which are conductive under an external pressure more than a threshold value and connected with a common electrode; forming an array substrate comprising a gate line and a data line; assembling the color substrate and the array substrate to form the touch display. The spacers abut against the gate line and the data line on the array substrate and capable of electrically connecting the common electrode with the corresponding gate line and the corresponding data line under an external pressure more than the threshold value. The touch display may further comprise a voltage detection circuit. The voltage detection circuit is connected with the gate line and the data line so as to detect whether the voltage on the gate line and the voltage on the data line is equal to the voltage of the common electrode.

Hereinafter, embodiments of the manufacturing method of the touch display will be described hereinafter in detail.

First Embodiment of The Manufacturing Method of the Touch Display

The touch display is formed by assembling a color filter substrate and an array substrate. The step of forming the color filter substrate with the plurality of spacers which are conductive under an external pressure and connected with the common electrode comprises the following steps.

Step 1011 of forming a color filter unit on an upper substrate.

Step 1012 of forming the common electrode on the upper substrate with the color filter unit;

Step 1013 of forming a black matrix with a plurality of black matrix via holes on the upper substrate with the common electrode; and Step 1014 of forming the plurality of spacers which are conductive under pressing on the upper substrate with the black matrix, the plurality of spacers being connected with the common electrode through the black matrix via holes.

Forming the array substrate by patterning process may comprise the following steps.

Step 1021 of depositing a gate metal film on a lower substrate and forming a gate line and a gate electrode by patterning.

Step 1022 of depositing a gate insulating film, an amorphous silicon film (a semiconductor film) and a doped amorphous silicon film (a doped semiconductor film) in this order on the lower substrate and forming an active layer on the gate electrode by patterning.

Step 1023 of depositing a source/drain metal film on the lower substrate and forming a data line, a source electrode and a drain electrode by patterning, wherein a thin film transistor (TFT) channel is formed between the source electrode and the drain electrode.

Step 1024 of depositing a passivation layer on the lower substrate and forming a plurality of passivation layer via holes at positions corresponding to the spacers so that the spacers abut against the gate line and the data line through the passivation layer via holes.

Step 1025 of depositing a transparent conductive film on the lower substrate and forming the pixel electrode and a conductive protection layer by patterning, wherein the conductive protection layer is remained at the passivation layer via holes.

The active layer comprises the stack of the patterned amorphous silicon film and the patterned doped amorphous silicon film and shaped like an island.

In the above embodiment, a five-patterning (five-mask) process is used as an example of the manufacturing method. The patterning process used here may comprise the processes of applying photoresist, masking, exposing and developing the photoresist, etching with a photoresist pattern, lifting-off the remaining photoresist and the like.

In practical, a four-patterning process or even a three-patterning process are also applicable here also. That is, the gate line, the data line and the thin film transistor on an array substrate may be formed by various ways. For example, as for a four-patterning processes, the above Step 1022 and Step 1023 can be combined into a single step and accomplished in one patterning process. Specifically, the gate insulating layer, the amorphous silicon film, the doped amorphous silicon film and the source/drain metal film are deposited on the lower substrate sequentially in this order, the active layer, the data line, the source electrode and the drain electrode are formed by patterning, and the TFT channel is formed between the source electrode and the drain electrode.

With the method of manufacturing the touch display in this embodiment of the invention, the plurality of spacers are provided on the common electrode formed on the color filter substrate, the plurality of spacers are capable of electrically connecting the common electrode with the gate line and the data line under an external pressure more than the threshold value, and thus a single touch display can have the functions of both of a touch screen and a display screen. Therefore, the manufacture process can be simplified and the manufacture cost can be reduced. In addition, with the method of manufacturing the touch display in this embodiment of the invention, the problem that the touched is not the seen due to the misalignment and refraction between the display screen and the touch screen can be avoided, and thus the color stability of the color filter substrate can be improved and the manufacture accuracy can be increased. Therefore, the product quality and the manufacture efficiency of the TFT-LCD employing the touch display with the above-described structure can be increased, and thus the manufacture cost can be further reduced.

Second Embodiment of The Manufacturing Method of the Touch Display

The second embodiment of the manufacturing method of the touch display is different from the first embodiment in that: the step of forming the color filter substrate with the plurality of spacers which are connected with the common electrode may comprise the following steps.

Step 1011' of forming a black matrix on an upper substrate;

Step 1012' of forming a color filter unit on the upper substrate with the black matrix;

Step 1013' of forming the common electrode on the upper substrate with the color filter unit; and Step 1014' of forming the plurality of spacers which are conductive under an external pressure on the upper substrate with the common electrode, wherein the plurality of spacers are connected with the common electrode.

The step of forming the array substrate can be the same as that in the first embodiment, and the detailed description thereof is omitted here for simplicity.

With the method of manufacturing the touch display in this embodiment of the invention, the plurality of spacers are provided on the common electrode formed on the color filter substrate, the plurality of spacers are capable of electrically connecting the common electrode with the gate line and the data line under an external pressure more than the threshold value, and thus a single touch display can have the functions of both of the touch screen and the display screen. Therefore, the manufacture process can be simplified and the manufacture cost can be reduced. In addition, with the method of manufacturing the touch display in this embodiment of the invention, the problem that the touched is not the seen due to the misalignment and refraction between the display screen and the touch screen can be avoided, and thus the color stability of the color filter substrate can be improved and the manufacture accuracy can be increased. Therefore, the product quality and the manufacture efficiency of the TFT-LCD employing the touch display with the above-described structure can be increased, and thus the manufacture cost can be further reduced.

Another embodiment of the invention provides a method of manufacturing a touch display and may comprise the following steps: providing a color filter substrate, the color filter substrate comprising an upper substrate and a common electrode formed on the upper substrate; providing an array substrate, the array substrate comprising a lower substrate, and a gate line, a data line and a pixel electrode formed on the lower substrate, wherein a plurality of spacers are formed on the array substrate and comprise a first spacer connected with the gate line and a second spacer connected with the data line; and assembling the color substrate and the array substrate to form the touch display, wherein the first and second spacers abut against the common electrode on the color filter substrate and are capable of electrically connecting the common electrode with the gate line and the data line respectively under an external pressure more than a threshold value.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method of manufacturing a touch display, comprising:
   providing a color filter substrate, the color filter substrate comprising an upper substrate and a common electrode formed on the upper substrate;
   providing an array substrate, the array substrate comprising a lower substrate, and a gate line, a data line and a pixel electrode formed on the lower substrate, wherein a plurality of spacers are formed on the array substrate and comprise a first spacer connected with the gate line and a second spacer connected with the data line; and
   assembling the color substrate and the array substrate to form the touch display,
   wherein the first and second spacers abut against the common electrode on the color filter substrate and are capable of electrically connecting the common electrode with the gate line and the data line respectively under an external pressure more than a threshold value.

2. A method of manufacturing a touch display, comprising:
   providing a color filter substrate, the color filter substrate comprising an upper substrate, a common electrode formed on the upper substrate, and a plurality of spacers formed on the common electrode and connected with the common electrode;
   providing an array substrate, the array substrate comprising a lower substrate, and a gate line, a data line and a pixel electrode formed on the lower substrate; and assembling the color substrate and the array substrate to form the touch display, wherein the plurality of spacers comprise a first spacer abutting against the gate line on the array substrate and a second spacer abutting against the data line on the array substrate, which are capable of electrically connecting the common electrode with the gate line and the data line respectively under an external pressure more than a threshold value.

3. The method of manufacturing the touch display according to claim 2, wherein providing the color filter substrate comprises the following steps:

forming a color filter unit on the upper substrate;

forming the common electrode on the upper substrate with the color filter unit;

forming a black matrix with a plurality of black matrix via holes on the upper substrate with the common electrode; and forming the plurality of spacers on the upper substrate with the black matrix, wherein the spacers are connected with the common electrode through the black matrix via holes.

4. The method of manufacturing the touch display according to claim 2, wherein the step of providing the color filter substrate comprises the following steps:

forming a black matrix on the upper substrate;

forming a color filter unit on the upper substrate with the black matrix;

forming the common electrode on the upper substrate with the color filter unit; and forming the plurality of spacers on the upper substrate with the common electrode.

5. The method of manufacturing the touch display according to claim 2, wherein providing the array substrate comprises the following steps:

forming the gate line, the data line and a thin film transistor on the lower substrate;

depositing a passivation layer on the lower substrate, and forming a plurality of passivation layer via holes in the passivation layer at positions corresponding to the spacers by patterning, so that the spacers abut against the gate line and the data line through the passivation layer via holes; and depositing a transparent conductive film on the lower substrate, and forming the pixel electrode and a conductive protection layer by patterning, the conductive protection layer being remained at the passivation layer via holes.

6. The method of manufacturing the touch display according to claim 2, further comprising:

providing a voltage detection circuit, wherein the voltage detection circuit is connected with the gate line and the data line so as to detect whether the voltage on the gate line and the voltage on the data line become equal to the voltage of the common electrode.

7. The method of manufacturing the touch display according to claim 6, wherein the voltage detection circuit is provided on the array substrate.

* * * * *